United States Patent

Heuser et al.

(10) Patent No.: US 8,530,928 B2
(45) Date of Patent: Sep. 10, 2013

(54) ENCAPSULATED OPTOELECTRONIC COMPONENT AND METHOD FOR THE PRODUCTION THEREOF

(75) Inventors: Karsten Heuser, Erlangen (DE); Christian Schmid, Regensburg (DE); Tilman Schlenker, Nittendorf (DE); Peter Groeppel, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/054,397

(22) PCT Filed: Jun. 19, 2009

(86) PCT No.: PCT/DE2009/000858
§ 371 (c)(1),
(2), (4) Date: May 4, 2011

(87) PCT Pub. No.: WO2010/006571
PCT Pub. Date: Jan. 21, 2010

(65) Prior Publication Data
US 2011/0266590 A1    Nov. 3, 2011

(30) Foreign Application Priority Data
Jul. 14, 2008   (DE) .......................... 10 2008 033 017

(51) Int. Cl.
*H01L 33/00* (2010.01)
*H01J 63/04* (2006.01)
*H01J 1/62* (2006.01)

(52) U.S. Cl.
USPC ............ 257/100; 313/511; 313/512; 313/504

(58) Field of Classification Search
USPC ......................................... 257/100; 313/504
See application file for complete search history.

(56) References Cited

U.S. PATENT DOCUMENTS

| | | | |
|---|---|---|---|
| 2002/0041916 A1* | 4/2002 | Burdick | 426/16 |
| 2003/0143423 A1* | 7/2003 | McCormick et al. | 428/690 |
| 2003/0189403 A1* | 10/2003 | Yamada et al. | 313/511 |
| 2004/0021416 A1* | 2/2004 | Chun et al. | 313/512 |
| 2004/0247949 A1* | 12/2004 | Akedo et al. | 428/704 |
| 2005/0079277 A1* | 4/2005 | Takashima et al. | 427/58 |
| 2008/0057260 A1* | 3/2008 | Buchhauser et al. | 428/76 |
| 2009/0051272 A1* | 2/2009 | Fukuda et al. | 313/504 |
| 2011/0300770 A1* | 12/2011 | Fukuda et al. | 445/58 |

FOREIGN PATENT DOCUMENTS

| | | |
|---|---|---|
| EP | 1 351 321 | 3/2003 |
| EP | 1 849 593 | 10/2007 |
| EP | 1849593 | * 10/2007 |
| GB | 2 438 772 | 12/2007 |
| GB | 2 439 001 | 12/2007 |
| GB | 2 442 685 | 4/2008 |
| JP | 2003-168571 | 6/2003 |
| JP | 2004-152590 | 5/2004 |
| JP | 2004-152664 | 5/2004 |
| JP | 2004-192822 | 7/2004 |
| WO | WO 2007/032175 | 3/2007 |
| WO | WO 2007/049427 | 5/2007 |
| WO | WO 2007/077810 | 7/2007 |

* cited by examiner

*Primary Examiner* — Long K Tran
*Assistant Examiner* — Dzung Tran
(74) *Attorney, Agent, or Firm* — Cozen O'Connor

(57) ABSTRACT

A method for encapsulating an optoelectronic component by depositing a diffusion barrier for protection against environmental influences by means of an atmospheric pressure plasma on at least one subarea of the surface of the optoelectronic component.

12 Claims, 3 Drawing Sheets

ENCAPSULATED OPTOELECTRONIC COMPONENT AND METHOD FOR THE PRODUCTION THEREOF

RELATED APPLICATIONS

This is a U.S. national stage of application No. PCT/DE2009/000858, filed on Jun. 19, 2009.

This patent application claims the priority of German application no. 10 2008 033 017.5, filed Jul.14, 2008, the disclosure content of which is hereby incorporated by reference.

FIELD OF INVENTION

The present invention is related to a method for encapsulating an optoelectronic component.

BACKGROUND OF THE INVENTION

A common problem in the production of optoelectronic components is their encapsulation for protection against environmental influences. With normal encapsulation techniques, pinholes or defects in the encapsulating layer still arise, which lead to leaks. By way of example, air humidity from the environment can penetrate through these leaks to the optoelectronic component and can destroy it over time.

By way of example, the optoelectronic component may be an organic light-emitting diode (OLED). An OLED may for example comprise the following layer sequence: an anode, a cathode and a radiation-emitting layer arranged between the two. In this case, the radiation-emitting layer can comprise an organic material. The holes which are emitted from the anode during operation recombine with the electrons emitted from the cathode in the radiation-emitting layer. The energy released by recombination can cause molecules in the radiation-emitting layer to emit radiation. The OLED is an optoelectronic electroluminescent component. By way of example, an OLED may have the following further layers: a hole-inducing layer, a hole-transporting layer, an electron-transporting layer and/or an electron-inducing layer. The optoelectronic components may also be other forms of electroluminescent components, as well as components which are not electroluminescent.

The problem is currently solved by a housing covering the optoelectronic component and by the space between the component and the housing also containing a getter. A getter is a material which absorbs or adsorbs disturbing substances, for example water from the air humidity, penetrating from the outside. Problems with this housing technique are that the points at which the housing is connected to the carrier substrate can not as yet be adequately sealed, which therefore leads, for example, to the ingress of air humidity. Furthermore, this technique is very complex and costly. In addition, the getter has only a limited capacity, after which it is saturated and cannot absorb any more substances. For cost reasons, this method is not feasible, in particular for large-area optoelectronic components. According to an embodiment of the invention, a "large-area" optoelectronic component means an optoelectronic component whose area is greater than or equal to 3 mm². It is also difficult to produce very thin optoelectronic components by this method.

SUMMERY OF THE INVENTION

One object of method variants of this invention is to provide a method, by means of which an optoelectronic component can be tightly encapsulated, for protection against environmental influences.

One method variant for encapsulating an optoelectronic component comprises the method steps
A) providing the optoelectronic component, as well as
B) depositing a diffusion barrier for protection against environmental influences by means of an atmospheric pressure plasma on at least one subarea of the surface of the optoelectronic component.

The deposition of the diffusion barrier by means of atmospheric pressure plasma can ensure that the deposited layer provides very good tightness. The diffusion barrier has no, or as good as no, pinholes or defects. A considerably better sealing is achieved than in the case of the conventional thin-film encapsulation variants. The optoelectronic component can therefore be effectively protected against environmental influences by the atmospheric pressure plasma encapsulation. This method is also suitable for very large-area applications.

The use of an atmospheric pressure plasma has a number of advantages over the use of a low-pressure plasma technique. The equipment requirement for the atmospheric pressure plasma is considerably less than for the low-pressure plasma. For the low-pressure plasma, it is necessary to introduce the component to be coated into a chamber in which the pressure is then reduced, after the deposition process, the pressure is matched to the normal pressure again, and the component is taken out of the chamber again. In contrast, when using the atmospheric pressure plasma, there is no need to introduce the component into a closed chamber. In this case, it is possible to coat the component in normal conditions, that is, in an air atmosphere at normal pressure. This is therefore also possible, for example, directly on a conveyer belt. Because there is no spatial restriction here, it is considerably easier, for example, to access selectively individual points on the component with machines which are used for deposition, and not to coat the entire surface as in the low-pressure chamber. The atmospheric pressure plasma can also be used in an inert gas atmosphere.

The diffusion barrier can be deposited with a thickness of 50 nm to 1000 nm. Preferably, it is deposited with a thickness of 100 nm to 250 nm. This encapsulation technique therefore enables the production of very thin optoelectronic components which nevertheless provide very good sealing against environmental influences. This method can also be applied very well to large-area components since the size of the optoelectronic component is in this case irrelevant from the technical point of view, which is in contrast to the housing technique in which the manufacture of very large housings represents a problem.

In the method, the diffusion barrier can be produced by depositing individual layers. In this case, two or more individual layers can be deposited one upon the other. Each of the individual layers may have a thickness of, for example, 50 to 100 nm. The tightness of the layer as a whole can be further enhanced by applying individual layers. Furthermore, layers with different thicknesses can thus be produced at different areas on the component.

The diffusion barrier may comprise $SiO_2$. Preferably, the entire diffusion barrier consists of amorphous $SiO_2$. The $SiO_2$ can in this case be formed first in the gas phase. A silane and a further compound employed as an oxygen source can be used to form the $SiO_2$. By way of example, $SiH_4$ can be used as silane, and, for example, $N_2O$ as oxygen source.

In one method variant, a plasma beam can be used for the deposition onto subareas of the optoelectronic component in method step B). This allows selective deposition of the diffusion barrier on the subareas. The plasma beam may in this case be moved over the surface of the component to be coated at a speed of 5 to 1000 m per minute. The diffusion barrier can therefore be deposited, as required, on very small, for example punctiform, subareas, but also on very large areas of the component.

In one method variant, the plasma can be produced in a plasma nozzle. It can be formed to a plasma beam in the plasma nozzle. A precursor can be supplied to the plasma beam in the plasma nozzle, from which the material forming the diffusion barrier layer is then generated. A plurality of precursors may also be used in this case. For example, two precursors can thus react in the plasma beam, and the reaction product of this reaction can then be deposited on the surface of the optoelectronic component.

By way of example, the precursors may be a silane and a compound which is used as an oxygen source.

In one method variant, a pulsed arc is produced in the plasma nozzle by means of a high-voltage discharge. A voltage in the range from 5 to 30 kV can be used for the high-voltage discharge. A frequency which is in the range from 10 to 100 kHz can be used for the high-voltage discharge. A direct-current discharge is used in another method variant.

In one method variant, method step A) comprises. the following method sub-steps: A1) providing a substrate, A2) applying a first electrode layer to the substrate, A3) applying an organic functional layer to the first electrode layer, as well as A4) applying a second electrode layer to the organic functional layer, wherein a layer stack is formed which comprises the first electrode layer, the second electrode layer and the organic functional layer.

A layer stack of the optoelectronic is therefore produced by method sub-steps A1) to A4). By way of example, the organic functional layer may be a light-emitting layer. The two electrode layers are used to make electrical contact with the component.

In a further method variant, method step A) comprises the application of a first encapsulating layer to the second electrode layer as a further method sub-step A5). The encapsulating layer is used to encapsulate the optoelectronic component, and therefore for protection against environmental influences.

In one method variant, the first encapsulating layer is applied by means of atmospheric pressure plasma. In this case, sufficiently good tightness is achieved simply by application of the first encapsulating layer. In this method variant, there is no need to apply further encapsulating layers. The first encapsulating layer may be applied under an inert gas atmosphere.

The layer stack generated in method sub-steps A1) to A4) has main surfaces which are the outer surfaces which run parallel to the layer sequence. Furthermore, the layer stack has side surfaces which are the outer surfaces which run at right angles to the layer sequence. By way of example, an optoelectronic component can be encapsulated by depositing the diffusion barrier onto the side surfaces of the layer stack. This method variant can be used, for example, when the layer stack already has a layer as the uppermost layer having a very high tightness so that, for example, air humidity can now penetrate only via the side surfaces of the layer stack.

In a further method variant, a thin-film encapsulating layer is applied to the second electrode layer in an additional method step after method sub-step A4). The optoelectronic component is already pre-encapsulated by the thin-film encapsulating layer. This already provides the optoelectronic component with a first basic sealing against environmental influences.

In a further method variant, a conductive transparent layer is applied to .the first substrate in an additional method step between method sub-steps A1) and A2).

In a further method variant, a second encapsulating layer is applied to the thin-film encapsulating layer in an additional method step. A particularly high level of tightness is obtained by the combination of the two different encapsulating layers.

By way of example, a cover plate can be used for the first encapsulating layer. This allows quick and efficient sealing of one or else both main surfaces of the layer stack, for example in the case of very large-area components. The optoelectronic component can therefore emit without large radiation losses for example through the main surface which, for example, has been encapsulated by a glass cover plate. In this method variant, the side surfaces of the layer stack then also need to be encapsulated in a sealed form. This can be done, for example, by depositing the diffusion barrier onto the side surfaces of the layer stack.

In a further method variant, a lacquer is used for the first encapsulating layer. By way of example, the lacquer layer can be applied on a previously deposited diffusion barrier. In this variant, the lacquer layer can be used, for example, as scratch protection. However, a method variant is also possible in which the lacquer layer is first applied, for example, to the second electrode layer, and the diffusion barrier is then applied to the lacquer layer in a subsequent method step. In this method variant, the layer stack and the second electrode layer, respectively can be protected by the lacquer layer against the plasma beam, by means of which the diffusion barrier is deposited.

The optoelectronic component can be encapsulated such that no cavity, i.e. no hollow space, is formed between the component and the encapsulation.

In addition to the method for encapsulating the optoelectronic component, the optoelectronic component itself is also claimed.

One embodiment of the optoelectronic component comprises a first substrate, a first electrode layer arranged on the first substrate, an organic functional layer arranged on the first electrode layer, a second electrode layer arranged on the organic functional layer, a first encapsulating layer arranged on the second electrode layer and a $SiO_2$ diffusion barrier, which has been deposited onto at least one subarea of the surface of the component by means of atmospheric pressure plasma.

In a further embodiment, the optoelectronic component additionally comprises a conductive transparent layer, which is arranged on the first substrate.

In a further embodiment, the optoelectronic component comprises a thin-film encapsulating layer, which is arranged on the second electrode layer.

In a further embodiment, the optoelectronic component comprises a second encapsulating layer, which is arranged on the thin-film encapsulating layer.

In a further embodiment, the component comprises a cover plate as the first encapsulating layer.

In a further embodiment, the component comprises a lacquer layer as the first encapsulating layer.

In a further embodiment, the component comprises a first encapsulating layer which has been deposited by means of atmospheric pressure plasma.

BRIEF DESCRIPTION OF THE DRAWINGS

Variants of the invention will be explained in more detail in the following with reference to figures and exemplary embodiments.

DETAILED DESCRIPTION OF THE DRAWINGS

Figure 1:
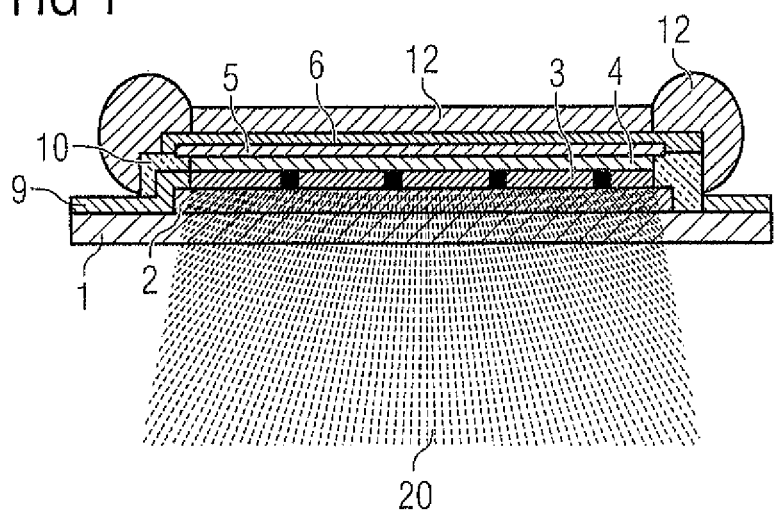
FIGS. 1 to 5 each show a schematic side view of one embodiment of the optoelectronic component.

FIG. 1 shows the schematic side view of one possible embodiment of the optoelectronic component. FIG. 1 shows the layer sequence: substrate 1, a conductive transparent layer 2 arranged thereon, a first electrode layer 3 arranged thereon, and the organic functional layer 4 arranged thereon. The second electrode layer 5 then follows on the organic functional layer 4. The first electrode layer 3 is electrically conductively connected via the contact 9. The first electrode layer 3 is electrically isolated from the second electrode layer 5 by the insulation layer 10. A current therefore flows through the organic functional layer 4 by applying an electrical voltage to the first electrode layer 3 and the second electrode layer 5. By way of example, visible radiation can be produced in the organic functional layer and can then be emitted, for example, via the lower face of the component as visible radiation 20. Exemplary embodiments are also feasible in which the radiation can be emitted via the upper face. Thin-film encapsulation 6 follows on the second electrode layer 5. The thin-film encapsulation 6 is used for pre-encapsulation of the optoelectronic component, so that it has already a first basic sealing against environmental influences. By way of example, the thin-film encapsulation can be applied by a PECVD process (plasma-enhanced chemical vapor deposition). The thin-film encapsulation 6 may, for example, consist of oxide or nitride layers such as SiO or SiN. A multiple-layer combination of nitride and oxide layers is also feasible. Since such a thin-film encapsulation 6 may, however, have pinholes or other leaks, further encapsulating elements are necessary. The component in FIG. 1 comprises a diffusion barrier 12, which has been deposited by means of atmospheric pressure plasma, on the thin-film encapsulation 6. In this embodiment, the diffusion barrier 12 is deposited both, on the upper main surface and on the side surfaces of the layer stack. The layer stack of the component is therefore completely encapsulated from the upper face and from the sides by the diffusion barrier 12, and is thus protected against environmental influences. The diffusion barrier 12 can be applied by means of atmospheric pressure plasmas in a plurality of individual layers; the various subareas may therefore have different thicknesses of the diffusion barrier 12.

Figure 2:
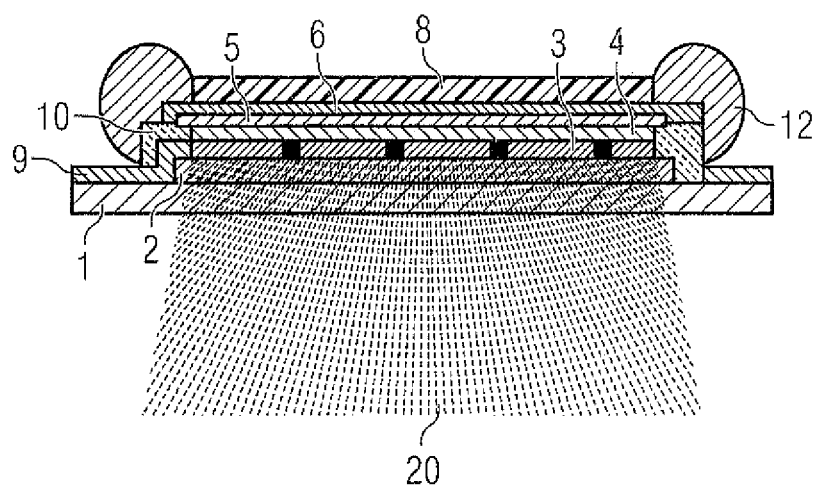

FIG. 2 shows a further embodiment of the optoelectronic component. Like the embodiment illustrated in FIG. 1, this embodiment likewise comprises the layer sequence: substrate 1, conductive transparent layer 2, first electrode layer 3, the organic functional layer 4 arranged thereon, and the second electrode layer 5 arranged thereon. The embodiment likewise comprises the contact 9, the insulation layer 10 and the thin-film encapsulation 6 which is arranged on the second electrode layer 5. In this embodiment, a lacquer layer 8 is arranged on the thin-film encapsulation 6. Therefore, in this embodiment, the main surface is encapsulated by the combination of thin-film encapsulation 6 and lacquer layer 8. The side surfaces of the layer stack in this embodiment, as in the embodiment illustrated in FIG. 1, are encapsulated by the diffusion barrier 12, which was deposited using atmospheric pressure plasma. In this embodiment, the diffusion barriers 12 were thus deposited by means of atmospheric pressure plasma only on the side surfaces.

Figure 3:
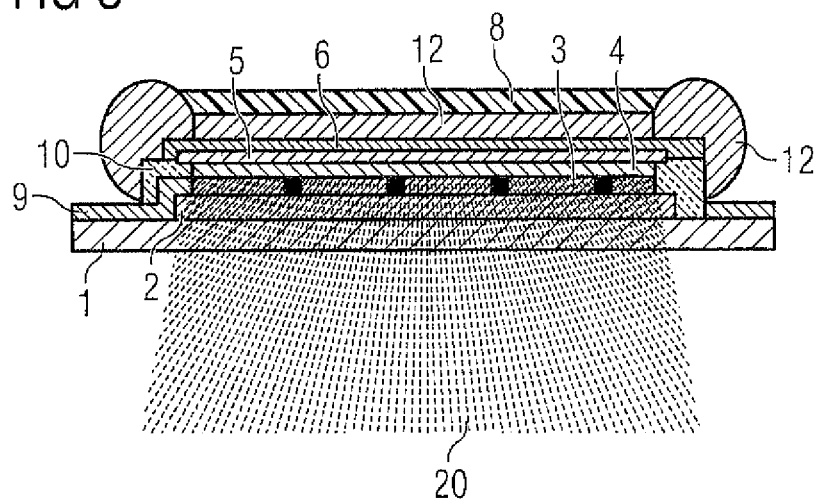

FIG. 3 shows a schematic side view of a further embodiment of the optoelectronic component. The embodiment illustrated in FIG. 3 may, for example, originate from the embodiment illustrated in FIG. 1 by also applying a lacquer layer 8 to the diffusion barrier 12 which was deposited by means of atmospheric pressure plasma. By way of example, the lacquer layer 8 may be used as scratch protection for the diffusion barrier 12.

Figure 4:
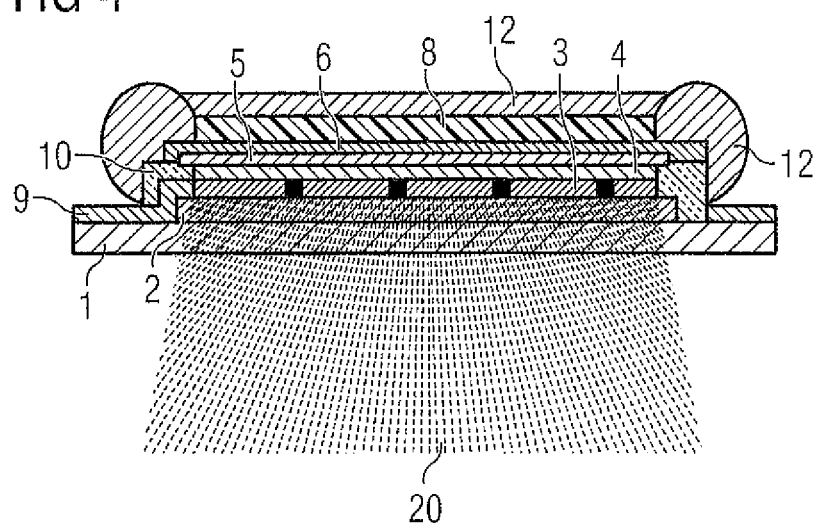

FIG. 4 shows a schematic side view of a further exemplary embodiment of the optoelectronic component. The embodiment illustrated in FIG. 4 may, for example, originate from the embodiment illustrated in FIG. 2 by depositing a diffusion barrier 12, by means of atmospheric pressure plasma, on the lacquer layer 8. The diffusion barrier 12 deposited on the main surface in this case merges into the diffusion barriers 12 deposited on the side surfaces. The component is therefore completely encapsulated by the diffusion barrier on the upper main surface and on the side surfaces. The lacquer layer 8 under the diffusion barrier 12 can, for example, protect the component while the diffusion barrier 12 is being deposited by means of atmospheric pressure plasma.

Figure 5:
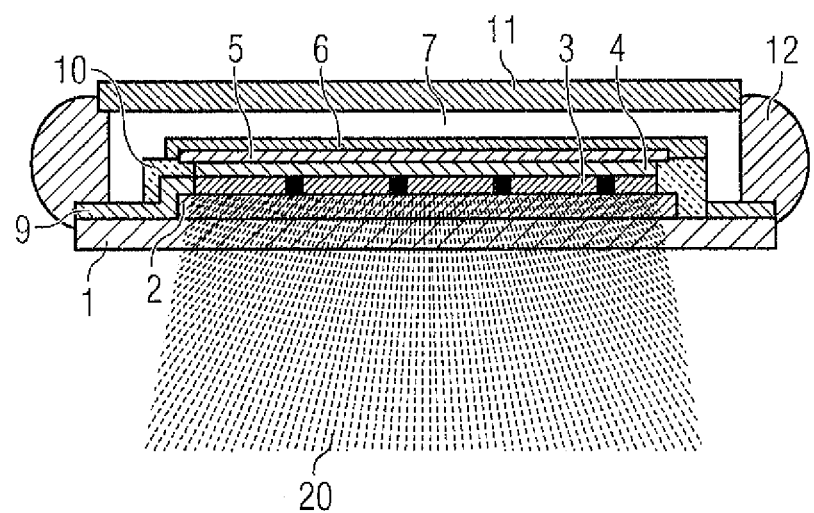

FIG. 5 shows a schematic side view of a further embodiment of the optoelectronic component. This comprises the layer sequence: substrate 1, conductive transparent layer 2, first electrode layer 3, the organic functional layer 4 arranged thereon and the second electrode layer 5 which follows thereon. The embodiment further comprises the contact 9 and the insulation layer 10 and the thin-film encapsulation 6 arranged on the second electrode layer 5. A second encapsulating layer 7 is applied on the thin-film encapsulation 6 and around the side surfaces of the layer stack. This second encapsulating layer 7 can be used for pre-encapsulation of the component, as well as for planarization of the thin-film encapsulation 6. The second encapsulating layer 7 may, for example, comprise a transparent epoxy. In this embodiment variant, a cover plate 11 follows on the second encapsulating layer 7. By way of example, the cover plate may be a glass substrate. In embodiments in which the radiation 20 is emitted downward, it is also possible to use cover plates 11 which are not transparent. The use of a cover plate 11 allows even large or rather large-area components to be encapsulated quickly and efficiently, on one or else both main surfaces. The side surfaces of the layer stack and the side surfaces of the second encapsulating layer 7 are encapsulated by means of the diffusion barrier 12, which was deposited by means of atmospheric pressure plasma. The component is therefore completely encapsulated to the lower face via the substrate, to the upper face via the cover plate and on the side surfaces via the diffusion barrier 12.

The invention is not limited by the description on the basis of the exemplary embodiments. In fact, the invention covers any new feature and any combination of features which, in particular, includes any combination of features in the patent claims, even if these features or this combination are/is not themselves or itself explicitly mentioned in the patent claims or exemplary embodiments.

The invention claimed is:

1. A method for encapsulating an optoelectronic component, comprising the steps of:
    A) providing the optoelectronic component; wherein method step A) comprises the following method substeps:
    A1) providing a substrate;
    A2) applying a first electrode layer to the substrate;
    A3) applying an organic functional layer to the first electrode layer;
    A4) applying a second electrode layer to the organic functional layer;
    wherein a layer stack with main surfaces and side surfaces is formed, which comprises the first electrode layer, the second electrode layer and the organic functional layer;

A5) applying a first encapsulating layer to the second electrode layer wherein a glass cover plate with a main surface facing away from the layer stack and side surfaces is used for the first encapsulating layer; and B) depositing a diffusion barrier for protection against environmental influences by means of an atmospheric pressure plasma to the side surfaces of the layer stack and the side surfaces of the glass cover plate leaving the main surface of the cover plate facing away from the layer stack substantially free of the diffusion barrier, wherein the optoelectronic component is encapsulated such that no cavity is formed between the diffusion layer and the component.

2. The method according to claim 1, wherein the diffusion barrier is deposited with a thickness of 50 nm to 1000 nm.

3. The method according to claim 1, wherein the diffusion barrier is deposited in at least two individual layers with a thickness of 50 to 100 nm each.

4. The method according to claim 1, wherein in method step B) a plasma beam is used for the deposition of the diffusion barrier to the side surfaces of the layer stack and the side surfaces of the cover plate.

5. The method according to claim 1, wherein a thin-film encapsulating layer is applied to the second electrode layer in an additional method step after A4) and wherein the diffusion barrier is also applied to the side surfaces of the thin-film encapsulating layer.

6. The method according to claim 1, wherein a conductive transparent layer is applied to the substrate in an additional method step between method steps A1) and A2).

7. The method according to claim 5, wherein a second encapsulating layer is applied to the thin-film encapsulating layer in an additional method step, and wherein the diffusion barrier is also applied to the side surfaces of the second encapsulating layer.

8. An optoelectronic component comprising a layer stack with main surfaces and side surfaces that comprises:
a first substrate;
a first electrode layer arranged on the first substrate;
an organic functional layer arranged on the first electrode layer;
a second electrode layer arranged on the organic functional layer;
a first encapsulating layer arranged above the second electrode layer, wherein the first encapsulating layer is a glass cover plate with a main surface facing away from the layer stack and side surfaces; and
a diffusion barrier which comprises $SiO_2$ and was deposited to the side surfaces of the layer stack and the side surfaces of the glass cover plate by atmospheric pressure plasma, wherein the main surface of the cover plate facing away from the layer stack is substantially free of the diffusion barrier and wherein the optoelectronic component is encapsulated such that no cavity is formed between the diffusion barrier and the component.

9. An optoelectronic component comprising:
a first substrate;
a conductive transparent layer arranged directly on the substrate;
a first electrode layer arranged on the conductive transparent layer;
an organic functional layer arranged on the first electrode layer;
a second electrode layer arranged on the organic functional layer;
a first encapsulating layer arranged on the second electrode layer; and
a diffusion barrier which comprises $SiO_2$ and was deposited onto at least one subarea of the surface of the component by atmospheric pressure plasma.

10. An optoelectronic component comprising a layer stack with main surfaces and side surfaces that comprises:
a first substrate;
a first electrode layer arranged on the first substrate;
an organic functional layer arranged on the first electrode layer;
a second electrode layer arranged on the organic functional layer;
a first encapsulating layer arranged above the main surface of the layer stack, wherein the first encapsulating layer is a lacquer layer with a main surface facing away from the layer stack and side surfaces; and
a diffusion barrier which comprises $SiO_2$ was deposited to the side surfaces of the layer stack and the side surfaces of the lacquer layer by atmospheric pressure plasma, and wherein the diffusion barrier is additionally deposited on the main surface of the lacquer layer facing away from the layer stack or between the second electrode layer and the lacquer layer.

11. The optoelectronic component according to claim 10, wherein the diffusion barrier is additionally deposited on the main surface of the lacquer layer facing away from the layer stack and wherein the layer stack comprises a thin-film encapsulating layer arranged on the second electrode layer.

12. The optoelectronic component according to claim 10, wherein the layer stack comprises a thin-film encapsulating layer arranged on the second electrode layer and the diffusion barrier is additionally deposited between the layer stack and the lacquer layer.

* * * * *